(12) United States Patent
Nagata et al.

(10) Patent No.: US 11,245,063 B2
(45) Date of Patent: Feb. 8, 2022

(54) SEMICONDUCTOR DEVICE AND SEMICONDUCTOR DEVICE MANUFACTURING METHOD (71) Applicant: DENSO CORPORATION, Kariya (JP)

(72) Inventors: Kensuke Nagata, Nagoya (JP); Katsutoshi Narita, Toyota (JP)

(73) Assignee: DENSO CORPORATION, Kariya (JP)

( * ) Notice: Subject to any disclaimer, the term of this patent is extended or adjusted under 35 U.S.C. 154(b) by 37 days.

(21) Appl. No.: 16/274,725

(22) Filed: Feb. 13, 2019

(65) Prior Publication Data

US 2019/0181324 A1    Jun. 13, 2019

Related U.S. Application Data

(62) Division of application No. 15/645,158, filed on Jul. 10, 2017, now Pat. No. 10,243,131.

(30) Foreign Application Priority Data

Jul. 29, 2016   (JP) .................. 2016-150306

(51) Int. Cl.
*H01L 31/00* (2006.01)
*H01L 35/34* (2006.01)
*H01L 35/22* (2006.01)
*H01L 35/02* (2006.01)
*H01L 23/34* (2006.01)
*H01L 27/16* (2006.01)

(52) U.S. Cl.
CPC ............. *H01L 35/34* (2013.01); *H01L 35/02* (2013.01); *H01L 35/22* (2013.01); *H01L 23/34* (2013.01); *H01L 27/16* (2013.01)

(58) Field of Classification Search
CPC ......... H01L 23/34; H01L 35/02; H01L 35/22; H01L 35/34; H01L 27/16
See application file for complete search history.

(56) References Cited

U.S. PATENT DOCUMENTS 3,571,675 A * 3/1971 Faust ..................... H01L 27/00
257/331
4,760,434 A * 7/1988 Tsuzuki ................. H01L 23/34
257/328

(Continued)

FOREIGN PATENT DOCUMENTS

JP    S63-081984 A    4/1988
JP    S63-278377 A    11/1988

(Continued)

OTHER PUBLICATIONS

Mar. 8, 2018 Office Action issued in U.S. Appl. No. 15/645,158.

(Continued)

*Primary Examiner* — Meiya Li
(74) *Attorney, Agent, or Firm* — Oliff PLC (57) ABSTRACT

A semiconductor device includes a semiconductor substrate, a polysilicon layer fixed to the semiconductor substrate, and a silicon nitride layer in contact with the polysilicon layer, wherein the polysilicon layer includes an n-type layer and a p-type layer in contact with the n-type layer; a semiconductor device manufacturing method includes forming the polysilicon layer covering at least one hydrogen-containing layer, and heating the polysilicon layer and the hydrogen-containing layer.

3 Claims, 5 Drawing Sheets

(56) References Cited

U.S. PATENT DOCUMENTS

| 4,816,891 A | * | 3/1989 | Nishizawa | H01L 29/0834 |
| | | | | 257/114 |
| 2009/0101915 A1 | * | 4/2009 | Weng | H01L 31/153 |
| | | | | 257/72 |
| 2011/0062545 A1 | * | 3/2011 | Nakajima | H01L 27/0255 |
| | | | | 257/470 |
| 2016/0225938 A1 | | 8/2016 | Feldman | |

FOREIGN PATENT DOCUMENTS

| JP | 2006-319186 A | 11/2006 |
| JP | 2009-088106 A | 4/2009 |
| JP | 2011-155289 A | 8/2011 |

OTHER PUBLICATIONS

May 17, 2018 Office Action issued in U.S. Appl. No. 15/645,158.
Nov. 15, 2018 Notice of Allowance issued in U.S. Appl. No. 15/645,158.
U.S. Appl. No. 15/645,158, filed Jul. 10, 2017 in the name of Nagata et al.

* cited by examiner

SEMICONDUCTOR DEVICE AND SEMICONDUCTOR DEVICE MANUFACTURING METHOD

CROSS-REFERENCE TO RELATED APPLICATIONS

This is a Division of application Ser. No. 15/645,158 filed on Jul. 10, 2017, which in turn is now allowed and claims priority to Japanese Patent Application No. 2016-150306 filed on Jul. 29, 2016. The disclosure of each of the prior applications is hereby incorporated by reference herein in its entirety.

INCORPORATION BY REFERENCE

The disclosure of Japanese Patent Application No. 2016-150306 filed on Jul. 29, 2016 including the specification, drawings and abstract is incorporated herein by reference in its entirety.

BACKGROUND

1. Technical Field

The technology disclosed herein relates to a semiconductor device and a semiconductor device manufacturing method.

2. Description of Related Art

Japanese Patent Application Publication No. 2011-155289 (JP 2011-155289 A) discloses a semiconductor device having a semiconductor substrate and a polysilicon layer formed on the semiconductor substrate. A diode (a so-called temperature detection diode) including a p-type layer and an n-type layer is formed on the polysilicon layer.

SUMMARY

The inventor(s) has found that, like JP 2011-155289 A, in the diode installed on the polysilicon layer on the semiconductor substrate, many electrically active defects such as dangling bonds or the like are present on an interface with the polysilicon layer. For this reason, a leakage current is likely to flow to the diode. Accordingly, in the specification, a technology of suppressing a leakage current of a diode installed on a polysilicon layer on a semiconductor substrate is provided.

A first aspect of the disclosure relates a semiconductor device. The semiconductor device includes a semiconductor substrate; a polysilicon layer fixed to the semiconductor substrate; and a silicon nitride layer in contact with the polysilicon layer, wherein the polysilicon layer includes a n-type layer and a p-type layer in contact with the n-type layer.

Further, "the polysilicon layer fixed to the semiconductor substrate" may be a polysilicon layer (a polysilicon layer in contact with the semiconductor substrate) directly formed on a surface of the semiconductor substrate, or may be a polysilicon layer formed on a surface of another layer in a state in which the other layer (for example, an insulating layer) is formed on the surface of the semiconductor substrate (i.e., a polysilicon layer when another layer is present between the semiconductor substrate and the polysilicon layer).

In the above-mentioned semiconductor device, a diode may be constituted by the n-type layer and the p-type layer in the polysilicon layer. In addition, a silicon nitride layer is disposed at a position in contact with the polysilicon layer. During film forming of the silicon nitride layer, a large amount of hydrogen atoms are contained in the silicon nitride layer. During film forming or after film forming of the silicon nitride layer and the polysilicon layer, the hydrogen atoms diffuse into the polysilicon layer from the silicon nitride layer. Accordingly, the hydrogen atoms combine defects such as dangling bonds or the like (defects in the polysilicon layer) together (a so-called hydrogen terminal). Accordingly, the defects become electrically stable and hardly any leakage current flows in the diode. According to the structure, a leakage current of the diode installed on the polysilicon layer on the semiconductor substrate can be suppressed.

A second aspect of the disclosure relates a semiconductor device manufacturing method. The semiconductor device manufacturing includes forming a polysilicon layer including an n-type layer and a p-type layer in contact with the n-type layer and a hydrogen-containing layer in contact with the polysilicon layer on a semiconductor substrate; and heating the polysilicon layer and the hydrogen-containing layer.

Further, "on the semiconductor substrate" may be a position in contact with the surface of the semiconductor substrate or may be a position spaced apart from the surface of the semiconductor substrate. That is, the polysilicon layer or the hydrogen-containing layer may be formed at a position in contact with the surface of the semiconductor substrate, or may be formed at a position spaced apart from the surface of the semiconductor substrate (a position with another layer interposed therebetween). In addition, "the hydrogen-containing layer" may be a silicon nitride layer or may be a layer containing hydrogen other than a silicon nitride layer.

In a second process, hydrogen atoms are detached from the hydrogen-containing layer by heating, and the hydrogen atoms diffuse into the polysilicon layer. Accordingly, the hydrogen atoms combine defects such as dangling bonds or the like (defects in the polysilicon layer), and the defects become electrically stable. As a result, hardly any leakage current flows in the diode of the polysilicon layer (the diode constituted by the n-type layer and the p-type layer in the polysilicon layer).

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
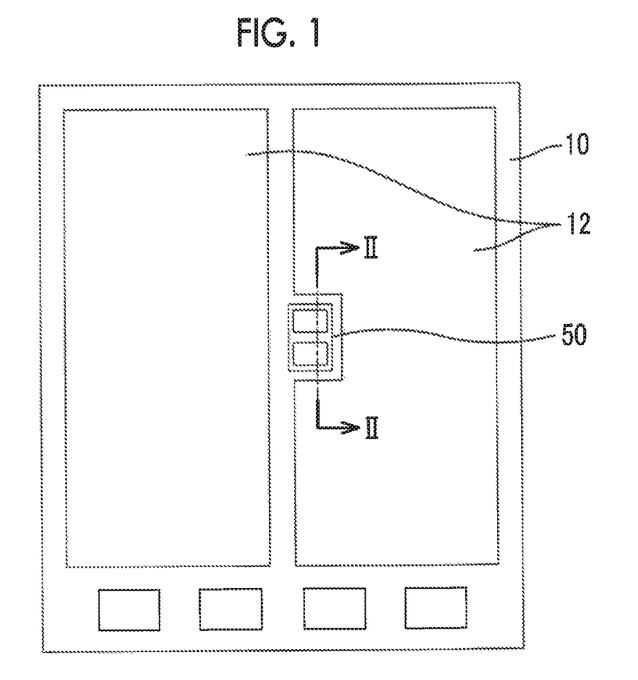
FIG. 1 is a plan view of a semiconductor device according to an embodiment.

As shown in FIG. 1, a semiconductor device 1 according to an embodiment includes a semiconductor substrate 10, a surface electrode 12, a back surface electrode (not shown) and a diode 50. The semiconductor substrate 10 is formed of, for example, silicon (Si), silicon carbide (SiC), or the like. An insulated gate bipolar transistor (IGBT), a metal oxide semiconductor field effect transistor (MOSFET), a diode, or the like, serving as a semiconductor element is formed on the semiconductor substrate 10. When the semiconductor element is, for example, the IGBT, an emitter region, a collector region, a body region, a drift region, and so on, are formed on the semiconductor substrate 10. The surface electrode 12 is installed on a surface of the semiconductor substrate 10. While not shown, a back surface electrode is installed on a back surface of the semiconductor substrate 10. When the semiconductor element installed on the semiconductor substrate 10 is turned on, current flows between the surface electrode 12 and the back surface electrode. The semiconductor element generates heat during an operation thereof.

Figure 2:
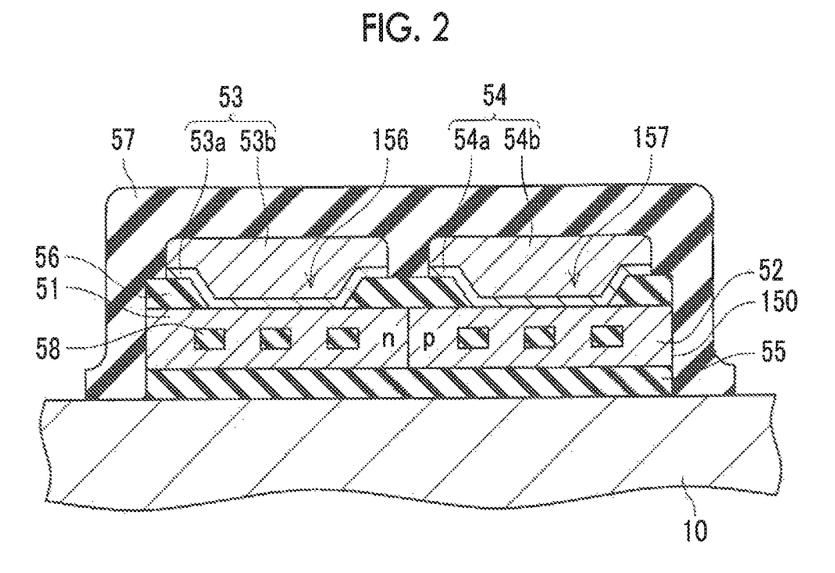
FIG. 2 is a cross-sectional view taken along line II-II of FIG. 1.

The diode 50 is disposed on the semiconductor substrate 10. The diode 50 is disposed on a central section of the surface of the semiconductor substrate 10. As shown in FIG. 2, the surface electrode 12 is not installed in a portion in which the diode 50 is present (i.e., the central section of the semiconductor substrate 10). An insulating film 55 is disposed on the semiconductor substrate 10 in the portion. The insulating film 55 is formed of, for example, silicon oxide ($SiO_2$).

A polysilicon layer 150 is disposed on the insulating film 55. The polysilicon layer 150 includes an n-type layer 51 and a p-type layer 52. The p-type layer 52 comes in contact with the n-type layer 51. The diode 50 is constituted by the n-type layer 51 and the p-type layer 52.

A plurality of silicon nitride layers 58 are disposed in the n-type layer 51. Similarly, a plurality of silicon nitride layers 58 are disposed also in the p-type layer 52. The entire peripheries of the silicon nitride layers 58 are covered by the polysilicon layer 150. The silicon nitride layers 58 are formed of, for example, semi-insulating silicon nitride (SInSiN) or p-type SiN.

An interlayer film 56 is formed on the surface of the polysilicon layer 150. The interlayer film 56 is insulating. The interlayer film 56 is formed of, for example, silicon oxide ($SiO_2$). The interlayer film 56 has two opening sections 156 and 157. The opening section 156 is disposed on the n-type layer 51 and the opening section 157 is disposed on the p-type layer 52.

A cathode electrode 53 is disposed to come in contact with the n-type layer 51 in the opening section 156. The cathode electrode 53 includes a barrier layer 53a in contact with a surface of the n-type layer 51 and an electrode layer 53b disposed on the barrier layer 53a. The barrier layer 53a is formed of, for example, titanium (Ti). The electrode layer 53b is formed of, for example, aluminum alloy (AlSi).

An anode electrode 54 is disposed to come in contact with the p-type layer 52 in the opening section 157. The anode electrode 54 includes a barrier layer 54a in contact with the surface of the p-type layer 52 and an electrode layer 54b in contact with the surface of the barrier layer 54a. The barrier layer 54a is formed of, for example, titanium (Ti). The electrode layer 54b is formed of, for example, aluminum alloy (AlSi).

A protective film 57 is disposed to cover the cathode electrode 53, the anode electrode 54 and the interlayer film 56. The protective film 57 is insulating. The protective film 57 is formed of, for example, polyimide.

Next, a method of manufacturing the semiconductor device 1 will be described. Further, since the manufacturing method is characterized by formation of the diode 50, processes related to formation of the diode 50 will be described below, and description of the other processes will be omitted.

Figure 3:
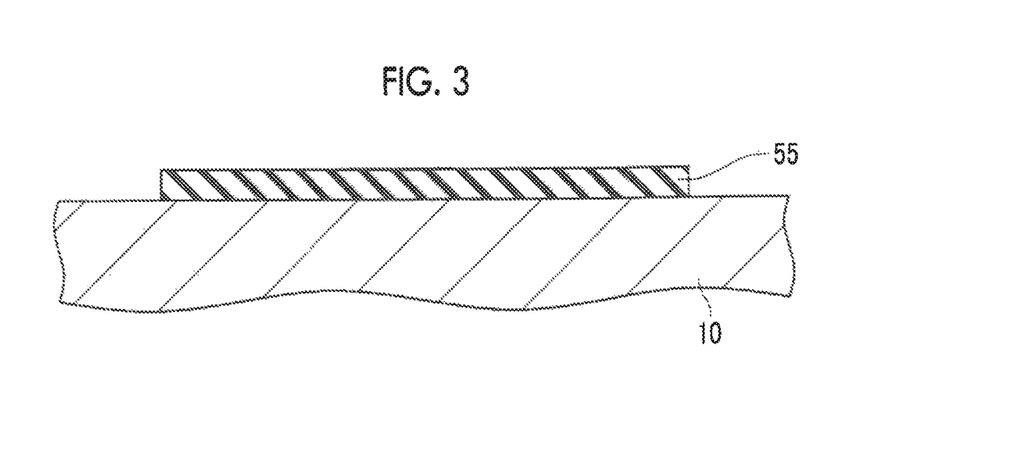
FIG. 3 is a view for describing a semiconductor device manufacturing method according to an embodiment, showing a cross-sectional view of the semiconductor device when an insulating film is formed on a semiconductor substrate.

First, as shown in FIG. 3, a silicon oxide ($SiO_2$) layer is deposited on the semiconductor substrate 10, and then, the insulating film 55 is formed by patterning the silicon oxide layer.

Figure 4:
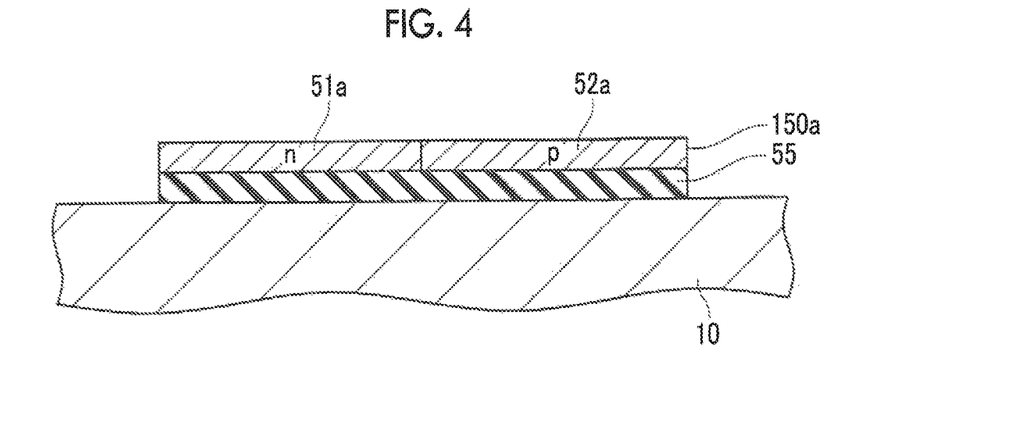
FIG. 4 is a view for describing the semiconductor device manufacturing method according to the embodiment, showing a cross-sectional view of the semiconductor device when a polysilicon layer is formed on the semiconductor substrate.
Figure 5:
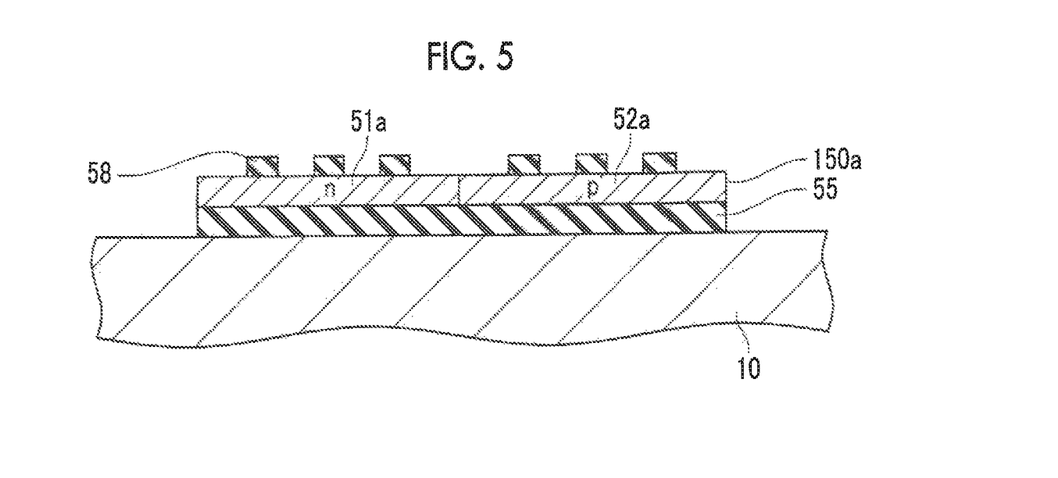
FIG. 5 is a view for describing the semiconductor device manufacturing method according to the embodiment, showing a cross-sectional view of the semiconductor device when a silicon nitride layer is formed on the semiconductor substrate.
Figure 6:
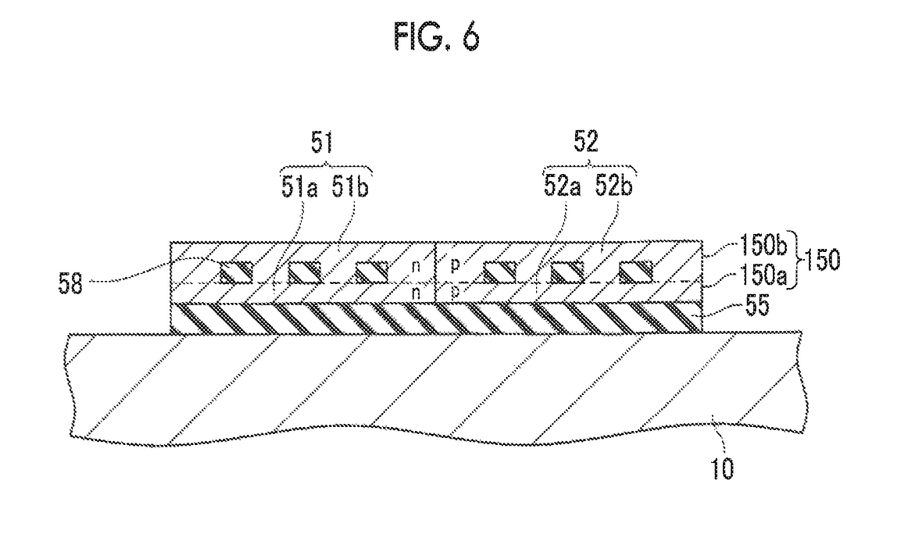
FIG. 6 is a view for describing the semiconductor device manufacturing method according to the embodiment, showing a cross-sectional view of the semiconductor device when a polysilicon layer is formed on the semiconductor substrate.

Next, the polysilicon layer 150 and the silicon nitride layers 58 are formed on the insulating film 55. The polysilicon layer 150 and the silicon nitride layers 58 are formed as described below. First, as shown in FIG. 4, a lower layer 150a formed of polysilicon is formed on the insulating film 55. Next, phosphorous (P) or arsenic (As) is injected to a portion (a left portion of FIG. 3) of the lower layer 150a to form the n-type layer 51a. Next, boron (B) is injected to a portion (a right portion of FIG. 3) of the lower layer 150a to form the p-type layer 52a. Next, as shown in FIG. 5, the silicon nitride layers 58 are formed on the lower layer 150a, and then, the silicon nitride layers 58 are patterned. The silicon nitride layers 58 are formed through a method such as a plasma CVD method or the like using silane ($SiH_4$) and ammonia ($NH_3$) or silane and nitrogen ($N_2$) as source materials. When the silicon nitride layers 58 are formed, hydrogen is introduced into the silicon nitride layers 58. For this reason, a hydrogen content in the silicon nitride layers 58 is increased. Next, as shown in FIG. 6, an upper layer 150b formed of polysilicon is formed on the silicon nitride layers 58. Next, phosphorous (P) or arsenic (As) is injected to a portion (a left portion of FIG. 6) of the upper layer 150b to form the n-type layer 51b. Next, boron (B) is injected to a portion (a right portion of FIG. 6) of the upper layer 150b to form the p-type layer 52b. The above-mentioned polysilicon layer 150 is constituted by the upper layer 150b and the lower layer 150a. In addition, the above-mentioned n-type layer 51 is constituted by the n-type layer 51b of the upper layer 150b and the n-type layer 51a of the lower layer 150a. In addition, the above-mentioned p-type layer 52 is constituted by the p-type layer 52b of the upper layer 150b and the p-type layer 52a of the lower layer 150a. The polysilicon layer 150 in which the silicon nitride layers 58 are disposed is completed by the above-mentioned processes.

Figure 7:
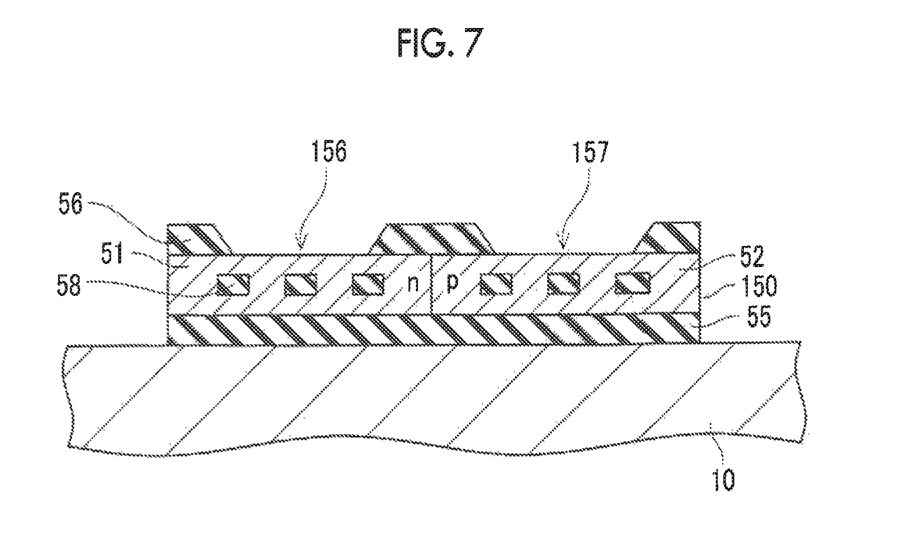
FIG. 7 is a view for describing the semiconductor device manufacturing method according to the embodiment, showing a cross-sectional view of the semiconductor device when an interlayer film is formed on the semiconductor substrate.
Figure 8:
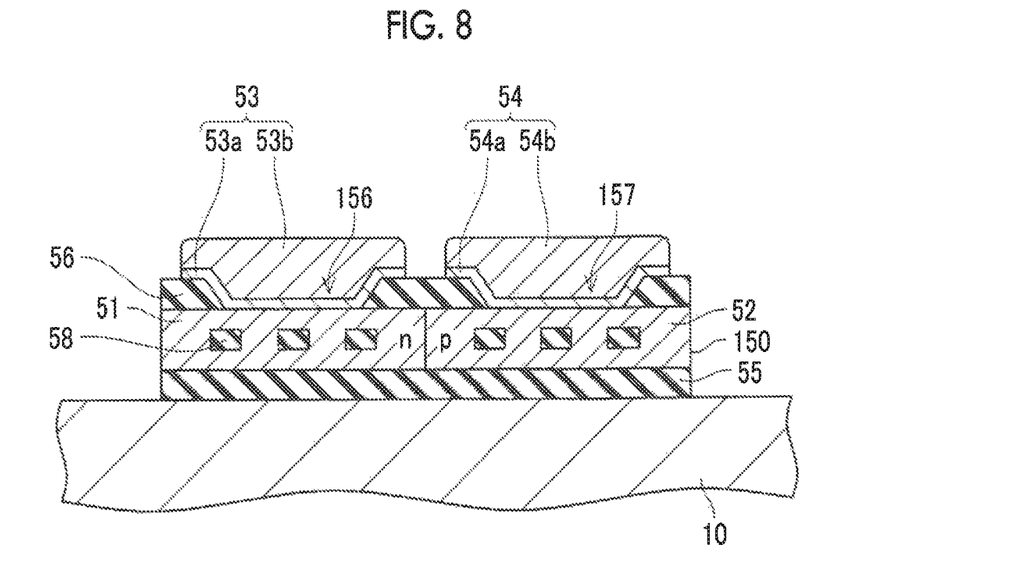
FIG. 8 is a view for describing the semiconductor device manufacturing method according to the embodiment, showing a cross-sectional view of the semiconductor device when a cathode electrode and an anode electrode are formed on the semiconductor substrate.

Next, as shown in FIG. 7, the interlayer film 56 is formed by depositing silicon oxide ($SiO_2$) on the polysilicon layer 150. Next, the opening sections 156 and 157 are formed in the interlayer film 56. After that, as shown in FIG. 8, the barrier layers 53a and 54a are formed on the surface of the polysilicon layer 150 in the opening sections 156 and 157 by forming a film using titanium (Ti) through a sputtering method or the like. Further, the electrode layers 53b and 54b are formed on the barrier layers 53a and 54a by forming a film using aluminum alloy (AlSi) through a sputtering method or the like. In this step, many electrically active crystalline defects such as dangling bonds or the like are present in an interface of the polysilicon layer 150 (i.e., an interface between the polysilicon layer 150 and the other layers (the interlayer film 56, the barrier layers 53a and 54a, the insulating film 55, and so on) and a surface (a side surface) to which the polysilicon layer 150 is exposed).

Next, the semiconductor substrate 10 is heated. Then, hydrogen atoms are detached from the silicon nitride layers 58. The hydrogen atoms detached from the silicon nitride layers 58 diffuse into the polysilicon layer 150. Accordingly, the hydrogen atoms combine defects (defects in the polysilicon layer 150) such as dangling bonds or the like that are present in the polysilicon layer 150 together. Accordingly, the defects are electrically stabilized. That is, the interface of the polysilicon layer 150 is terminated by the hydrogen atoms.

Next, the protective film 57 is formed by forming and patterning a polyimide film. Accordingly, a structure of the diode 50 shown in FIG. 2 is obtained.

Next, an operation of the semiconductor device 1 will be described. When the semiconductor element in the semiconductor substrate 10 is operated, the semiconductor substrate 10 heats to a high temperature. The diode 50 is used as a temperature detection diode configured to measure a temperature of the semiconductor substrate 10. A forward current having a constant value flows in the diode 50. When a temperature of the diode 50 varies according to a variation in temperature of the semiconductor substrate 10, a forward voltage drop of the diode 50 varies. Accordingly, the temperature of the semiconductor substrate 10 can be measured by measuring the forward voltage drop of the diode 50. Since the interface of the polysilicon layer 150 is terminated by the hydrogen, a leakage current cannot easily occur in the diode 50. For this reason, the current the flows to a p-n junction of the diode 50 can be precisely controlled, and correlation between the forward voltage drop and the temperature of the diode 50 is further stabilized. Accordingly, according to the diode 50, the temperature of the semiconductor substrate 10 can be more accurately measured.

Figure 9:
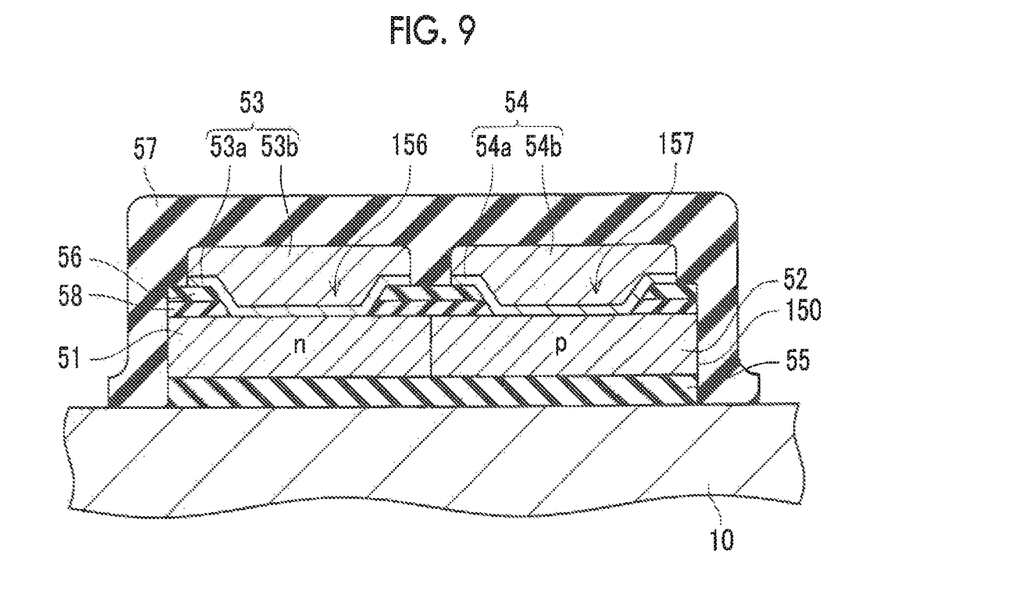
FIG. 9 is a cross-sectional view of a semiconductor device of a variant corresponding to FIG. 2.
Figure 10:
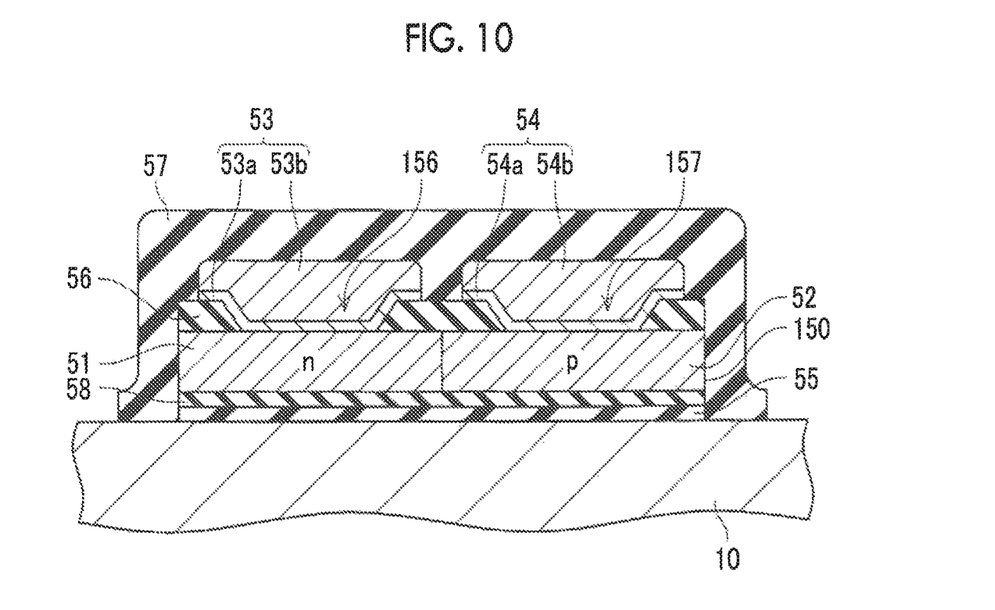
FIG. 10 is a cross-sectional view of a semiconductor device of a variant corresponding to FIG. 2.
Figure 11:
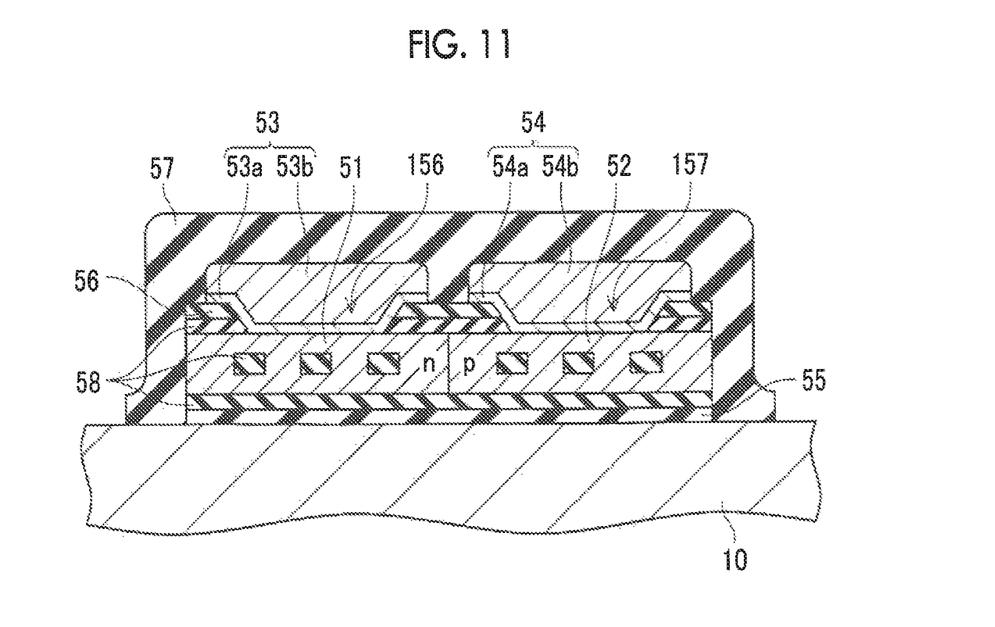
FIG. 11 is a cross-sectional view of a semiconductor device of a variant corresponding to FIG. 2.

Further, while the configuration in which the silicon nitride layers 58 are disposed in the polysilicon layer 150 has been described in the above-mentioned embodiment, the silicon nitride layers 58 may be disposed at other positions adjacent to the polysilicon layer 150. For example, as shown in FIG. 9, the silicon nitride layers 58 may be disposed between the polysilicon layer 150 and the interlayer film 56. Alternatively, as shown in FIG. 10, the silicon nitride layers 58 may be disposed between the insulating film 55 and the polysilicon layer 150. In addition, as shown in FIG. 11I, dispositions of the silicon nitride layers 58 in FIGS. 2, 9 and 10 may be combined. In addition, the insulating film 55 and the interlayer film 56 (i.e., silicon oxide) can easily contain moisture during film forming. For this reason, when the silicon oxide film and the polysilicon layer 150 are adjacent to each other, the leakage current can easily flow to the interface thereof due to an influence of the moisture. As shown in FIGS. 9 to 11, when the silicon nitride layers 58 are disposed between the silicon oxide film and the polysilicon layer 150, entry of the moisture into the polysilicon layer 150 can be prevented, and further, the leakage current can be suppressed.

In addition, in the above-mentioned embodiment, hydrogen atoms are detached from the silicon nitride layers 58 by heating the semiconductor substrate 10. However, when the electrode such as the cathode electrode 53, the anode electrode 54, or the like, is formed by film forming, both of a film forming process and a heating process may be performed in combination by heating the semiconductor substrate 10.

In addition, in the above-mentioned example, while the silicon nitride layers 58 are used as a layer for supplying hydrogen to the polysilicon layer 150 in the manufacturing process, another layer containing hydrogen may be used. A layer having a hydrogen content larger than that of the polysilicon layer 150 may be used during film forming.

The technical components disclosed herein will be listed below. Further, each of the following technical components is independently useful.

In the configuration of the example disclosed herein, the n-type layer and the p-type layer of the polysilicon layer function as a temperature detection diode configured to detect a temperature of the semiconductor substrate.

According to the above-mentioned configuration, since the leakage current of the temperature detection diode installed on the polysilicon layer is suppressed, the temperature of the semiconductor substrate can be more accurately detected.

Hereinabove, while the embodiment has been described in detail, this is merely exemplarily provided and not limited to the scope of the claims. Various modifications and variations of the above-exemplified specific examples are included in the technology disclosed in the claims. Technical components described in the specification or the drawings exhibit technical usefulness solely or in various combinations but are not limited to the combinations of the claims at the time the application was filed. In addition, the technology disclosed in the specification or the drawings can achieve a plurality purposes at the same time and has technical usefulness by itself by achieving one of the purposes.

What is claimed is:
1. A semiconductor device, comprising:
 a semiconductor substrate;
 a polysilicon layer fixed to the semiconductor substrate by an insulating film;
 silicon nitride layers in contact with the polysilicon layer;
 electrode layers formed on the polysilicon layer; and
 a protective film covered and directly contacted: i) peripheries of each of the electrode layers, the polysilicon layer and the insulating film, and ii) portions of a top surface of the semiconductor substrate,
 wherein a material of the protective film is different from that of the insulating film,
 wherein the polysilicon layer comprises an n-type layer abutting a p-type layer in a lateral direction, and the polysilicon layer includes at least one of said silicon nitride layers in each of the n-type layer and the p-type layer.

2. The semiconductor device according to claim 1, wherein the n-type layer and the p-type layer constitute a temperature detection diode configured to detect a temperature of the semiconductor substrate.

3. The semiconductor device according to claim 1, wherein the entire peripheries of the silicon nitride layers are covered by the polysilicon layer.

* * * * *